(12) United States Patent
Sarraj

(10) Patent No.: US 6,636,084 B2
(45) Date of Patent: Oct. 21, 2003

(54) SAMPLE AND HOLD CIRCUIT

(75) Inventor: Maher M. Sarraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 232 days.

(21) Appl. No.: 09/739,189

(22) Filed: Dec. 18, 2000

(65) Prior Publication Data

US 2002/0000924 A1 Jan. 3, 2002

Related U.S. Application Data

(60) Provisional application No. 60/171,762, filed on Dec. 22, 1999.

(51) Int. Cl.[7] .............................................. G11C 27/02
(52) U.S. Cl. ........................................... 327/95; 327/96
(58) Field of Search ............................... 327/91, 93–96; 341/122

(56) References Cited

U.S. PATENT DOCUMENTS

| | | | | | |
|---|---|---|---|---|---|
| 5,532,624 | A | * | 7/1996 | Khoury ........................ | 327/95 |
| 5,689,201 | A | * | 11/1997 | Temes et al. ................. | 327/95 |
| 6,137,321 | A | * | 10/2000 | Bazarjani ..................... | 327/96 |
| 6,147,522 | A | * | 11/2000 | Rhode et al. ................. | 327/93 |
| 6,169,427 | B1 | * | 1/2001 | Brandt ......................... | 327/94 |
| 6,184,726 | B1 | * | 2/2001 | Haeberli et al. .............. | 327/96 |

* cited by examiner

*Primary Examiner*—My-Trang Nuton
(74) *Attorney, Agent, or Firm*—W. Daniel Swayze, Jr.; W. James Brady; Frederick J. Telecky, Jr.

(57) ABSTRACT

A sample and hold circuit includes an operational amplifier and a plurality of switched capacitors, the switched capacitors introducing a closed loop gain of one-half for the operational amplifier.

20 Claims, 2 Drawing Sheets

US 6,636,084 B2

SAMPLE AND HOLD CIRCUIT

This application claims priority under 35 USC §119(e)(1) of provisional application No. 60/171,762 filed Dec. 22, 1999.

TECHNICAL FIELD OF THE INVENTION

This invention relates generally to analog and digital electronics, and more particularly to an improved sample and hold circuit.

BACKGROUND OF THE INVENTION

The bandwidth and settling time of a sample and hold stage of a switched capacitor circuit is a function of the closed looped gain in an operational amplifier utilized in the stage. To sample and track an analog input, a unity gain is needed across the operational amplifier. This requirement places the operational amplifier at a unity gain operating point. For a single pole system, the bandwidth and settling time of a sample and hold stage are functions of the transconductance of the operational amplifier divided by the total output load capacitance.

To increase the speed at which the sample and hold stage can sample and track the analog input, conventional sample and hold stages increase the transconductance of the operational amplifier. One means of increasing the transconductance of the operational amplifier is by increasing the internal bias current of the input devices inside the operational amplifier. However, such a technique also undesirably increases the power dissipation of the sample and hold stage and reduces the bias swing of transistors within the input stage of the operational amplifier. Such technique also decreases the output impedance of devices within the operational amplifier with the negative effect of reducing the open loop gain of the operational amplifier. A second alternative means of increasing the transconductance of the operational amplifier involves increasing the aspect ratio of devices, such as transistors, inside the input stage of the operational amplifier. However, this second technique also undesirably increases the input capacitance of the operational amplifier, thereby worsening feedback caused by parasitic capacitances. Thus, both of these alternatives do not achieve improving the bandwidth or response time of sample and hold stages of switched capacitor circuits without either increasing power dissipation or the input capacitance of the operational amplifier.

As data converters such as analog to digital converters and digital to analog converters are used increasingly in high-speed data transfer applications, in many cases, the bandwidth and settling time of the sample and hold stage in a switched capacitor circuit is the principal bottleneck in time critical applications. Such switched capacitor circuits are also used significantly in filters designed for high-speed applications. Again, the bandwidth and settling time of the sample and hold stage in switched capacitor circuits in such filters becomes a bottleneck within such high-speed applications.

SUMMARY OF THE INVENTION

In accordance with the present invention, an improved sample and hold circuit is provided that substantially eliminates or reduces disadvantages and problems associated with previously developed systems and methods.

In one embodiment of the present invention, a sample and hold circuit is disclosed that includes an operational amplifier, the operational amplifier having a first and a second input and an output. The sample and hold circuit also includes a first feedback path of the operational amplifier, the first feedback path including a first capacitor coupled to the first input of the operational amplifier and a first switch coupled to the output of the operational amplifier. The sample and hold circuit further includes a second feedback path including a second capacitor coupled to the first input of the operational amplifier and a second switch coupled to the output of the operational amplifier. The sample and hold circuit additionally includes a third capacitor coupled to the first input of the operational amplifier.

In a second embodiment, a sample and hold circuit is disclosed that includes an operational amplifier and a plurality of switched capacitors, the switched capacitors introducing a closed loop gain of one-half for the operational amplifier.

Technical advantages of the present invention include presenting an improved sample and hold circuit addressing disadvantages of previous systems and methods. In particular, various embodiments of the present invention increase the bandwidth of a sample and hold circuit without increasing the input parasitic capacitance of the operational amplifier used in such sample and hold circuit. Additionally, various embodiments of the present invention improve the speed at which analog inputs may be sampled and held without dissipating additional power in the operational amplifier of such sample and hold circuit. A further advantage of various embodiments of the present invention is that a sample and hold circuit is presented that allows an increased bandwidth for such sample and hold circuit without substantial degradation of the opened loop gain of the operational amplifier or the bias swing of devices inside the operational amplifier. Yet another advantage of the present invention is that a sample and hold circuit is presented that may be used in a switched capacitor circuit where the settling time required is less than a few nanoseconds and where minimal parasitic capacitors are required.

Other technical advantages will be readily apparent to one skilled in the art from the following figures, descriptions and claims.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

Figure 1:
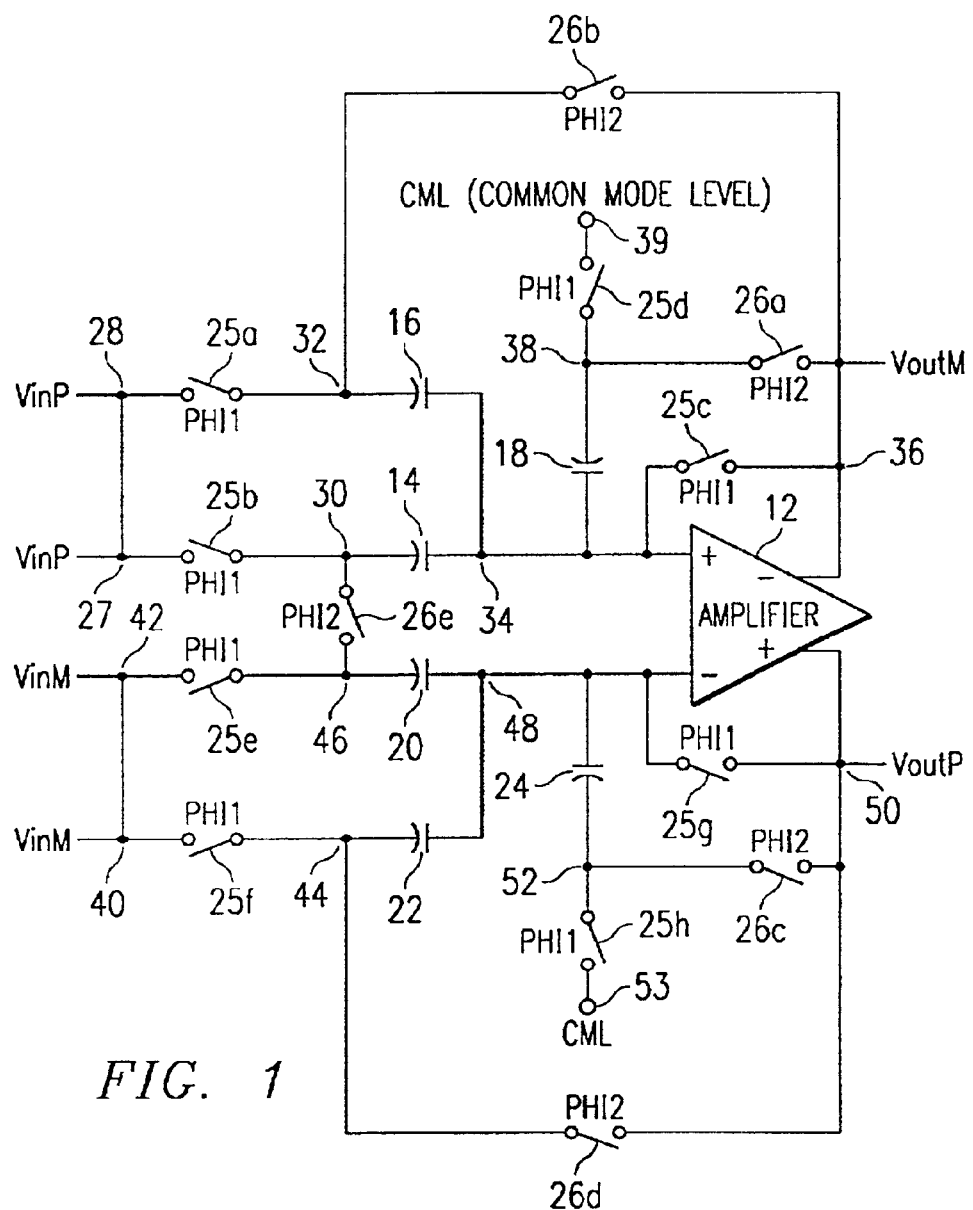
FIG. 1 illustrates a sample and hold circuit implemented according to the teachings of the present invention.

FIG. 1 illustrates one embodiment of a sample and hold circuit 10 that utilizes an operational amplifier 12 and switched capacitors 14, 16, 18, 20, 22, and 24 in order to track analog inputs with a digital output. Sample and hold circuit 10 increases the bandwidth and decreases the response time necessary for such sampling and tracking of the analog input from conventional sample and hold circuits and techniques without undesirable consequences such as, for example, increased power dissipation, reducing the bias swing of transistors within a utilized operational amplifier, and/or increasing the parasitic capacitances of such an operational amplifier.

In the illustrated embodiment, sample and hold circuit 10 is a differential sample and hold circuit utilizing a differential operational amplifier as operational amplifier 12 in order to sample and track the differential analog inputs defined by analog signals $V_{in}P$, applied at nodes 27 and 28, and $V_{in}M$, applied at nodes 40 and 42, at a digital output defined by signals $V_{out}P$ at node 50 and $V_{out}M$ at node 36.

In the illustrated embodiment, sample and hold circuit 10 includes six capacitors 14, 16, 18, 20, 22, and 24, as well as eight switches 25a through 25h and five switches 26a through 26e. All capacitors 14, 16, 18, 20, 22 and 24 have a substantially equivalent capacitance. In configuration, switch 25a is coupled between node 28 and capacitor 16 and switch 26b at node 32. Switch 25b is coupled between node 27 and capacitor 14 and switch 26e at node 30. Capacitor 14 is also coupled to capacitor 16, capacitor 18, switch 25c, and the positive input terminal of operational amplifier 12 at node 34. Capacitor 18 is further coupled to switches 25d and 26a at node 38. Switch 25c is also coupled to the negative output terminal of operational amplifier 12, switch 26a, and switch 26b at node 36. Switch 25d is further coupled to a common mode level voltage at node 39.

Similarly, switch 25e is coupled between node 42 and capacitor 20 and switch 26e at node 46. Switch 25f is coupled between node 40 and capacitor 22 and switch 26d at node 44. Capacitor 20 is also coupled to capacitor 22, capacitor 24, switch 25g, and the negative input terminal of operational amplifier 12 at node 48. Capacitor 24 is further coupled to switch 25h and switch 26c at node 52. Switch 25g is also coupled to switch 26c, switch 26d, and the positive output terminal of operational amplifier 12 at node 50. Switch 25h is further coupled to a common mode level voltage at node 53.

Figure 2:
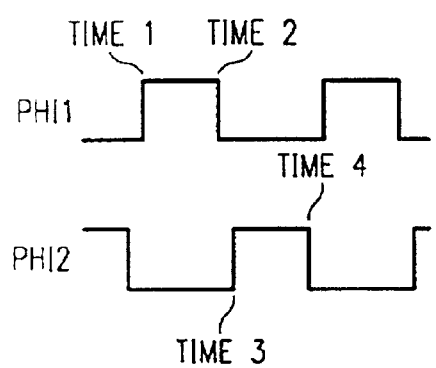
FIG. 2 illustrates a timing diagram indicating the relative switching times of switches used to implement the sample and hold circuit of FIG. 1.

The operation of sample and hold circuit 10 is illustrated in connection with the timing diagram of FIG. 2. The timing diagram of FIG. 2 illustrates a timing diagram representing one embodiment of the switching times for switch groups 25 and 26. In particular, the timing signal labeled PHI 1 corresponds to the opening and closing of all switches 25 at substantially equivalent times. Similarly, the timing signal labeled PHI 2 corresponds to the opening and closing of switches 26 at substantially equivalent times. In particular, each rising edge of PHI 1 represents the time (illustrated as "Time 1") at which all switches 25 are closed. The falling edge of PHI 1 illustrates the time (illustrated as "Time 2") at which all switches 25 are open. Similarly, the rising edge of PHI 2 illustrates the time (illustrated as "Time 3") at which all switches 26 are closed and the falling edge of PHI 2 represents the switching time (illustrated as "Time 4") at which all switches 26 are opened.

In operation of sample and hold circuit 10, at Time 1 as indicated in FIG. 2, switches 25 are closed causing analog voltage inputs $V_{in}P$ to be sampled across switches 25a and 25b at nodes 30 and 32. Similarly, analog voltage signal $V_{in}M$ is sampled across closed switches 25e and 25f at nodes 44 and 46. Additionally, a common mode level voltage supplied at nodes 39 and 53 are sampled across closed switches 25d and 25h, respectively, at nodes 38 and 52. Nodes 34 and 36, and nodes 48 and 50, are each shorted together by the closure of switches 25c and 25g respectively. Thus, nodes 34, 36, 48, and 50 all settle to the dc operating point of operational amplifier 12.

At Time 2 in operation of sample and hold circuit 10, switches 25 are closed as described with reference to FIG. 2, thereby holding analog voltage signal $V_{in}P$ at nodes 30 and 32, and holding analog voltage signal $V_{in}M$ at nodes 44 and 46.

At Time 3 in operation of sample and hold circuit 10, switches 26 are closed as described with reference to FIG. 2. Upon enclosure of switches 26, a transfer function of voltage signal $V_{out}M$ at node 36 as compared to the voltage signal $V_{in}P$ being held at nodes 30 and 32 is one-half. Therefore, voltage signal $V_{out}M$ is equal to voltage signal $V_{inP}$ divided by 2. As two inputs $V_{inP}$ are provided at nodes 30 and 32, output signal $V_{outM}$ is equal to $V_{in}P/2$ plus $V_{in}P/2$, or $V_{inP}$. In particular, the voltage transfer function of the voltage at node 36 over the voltage at node 30 is defined by the equivalent impedance of the two feedback paths that include capacitors 16 and 18 respectively, divided by the input impedance that is defined by capacitor 14. As capacitors 14, 16, and 18 all have an equivalent capacitance (hereafter "C") which is inversely proportional to impedance, the transfer function of the voltage at node 36 over the voltage at node 30 is equal to one-half C divided by C, which is equal to one-half. Thus, $V_{out}M$ is equal to $V_{in}/2$, or the transfer function of the voltage at bode 36 over the voltage at node 30 is equal to ½.

Similarly, the transfer function of the voltage at node 36 over the voltage at node 32 is defined by the ratio of the feedback impedance introduced by capacitors 16 and 18 over the impedance introduced by the input impedance, in this case, capacitor 16. Thus, following logic similar to that described above, it can easily be shown that the transfer function of the voltage at node 36 over the voltage at node 32 is also equal to one-half. Thus, by summing the two inputs provided at nodes 27 and 28, the complete transfer function of:

$$\frac{V_{out}M}{V_{in}P} = \frac{1}{2} + \frac{1}{2} = 1$$

thereby generating the magnitude of $V_{out}M$ necessary to sample and hold the magnitude of input $V_{in}P$ while limiting the closed loop gain of operational amplifier 12 to one-half.

Thus, by employing a combination of switched capacitors, sample and hold circuit 10 can achieve an output $V_{out}M$ equal to the magnitude of its sampled input $V_{in}P$ using a closed loop gain across operational amplifier 12 of only one-half. It can easily be seen that, using capacitors 20, 22, and 24, the positive output $V_{out}P$ may also directly reflect the magnitude of the input voltage $V_{in}M$ using a closed loop gain of operational amplifier 12 of only one-half. Thus, a differential output of operational amplifier 12, as reflected across node 36 and node 50, may be achieved that is a direct sampling of the differential input applied across nodes 27 and 28 to nodes 40 and 42. Thus, between Time 3 and Time 4 as illustrated in FIG. 2, the differential output across nodes 36 and 50 is equivalent to the differential input across, for example, nodes 28 and 42 at Time 2.

At Time 4, switches 26 are again opened, in preparation for the next cycle of sampling and holding an analog signal that is begun at the closing of switches 25 as described at Time 1 in reference to FIG. 2.

Although operational amplifier 12 is illustrated in FIG. 1 as a differential operational amplifier with both differential inputs and differential outputs, the configuration of switched capacitors utilized in FIG. 1 may be easily adapted for use in an embodiment of operational amplifier 12 with differential inputs and a single output. In such an embodiment, capacitors 14, 16 and 18 and switches 25a through 25d, 26a, and 26b, and the nodes coupling them, are unnecessary. In particular, node 46, instead of being coupled to node 30 by switch 26e, would instead be coupled to a common mode level voltage by switch 26e. The positive differential input of operational amplifier 12 would be coupled directly to a common mode level voltage in such an embodiment. The negative differential output of operational amplifier 12 at node 36 would instead be a single positive output normally used for a non-differential operational amplifier 12. In any event, this alternative embodiment would achieve the same sampling of the magnitude of the analog voltage signal $V_{in}P$ at the output $V_{out}M$ as shown at node 36 using a closed loop gain of one-half for operational amplifier 12. The selection of the illustrated differential operational amplifier 12 or of the described alternative embodiment using a non-differential operational amplifier 12 may depend upon the particular application for which sample and hold circuit 10 is utilized, and may take into account the significance of outside factors such as noise introduced across operational amplifier 12 when a differential configuration is not utilized.

Figure 3:
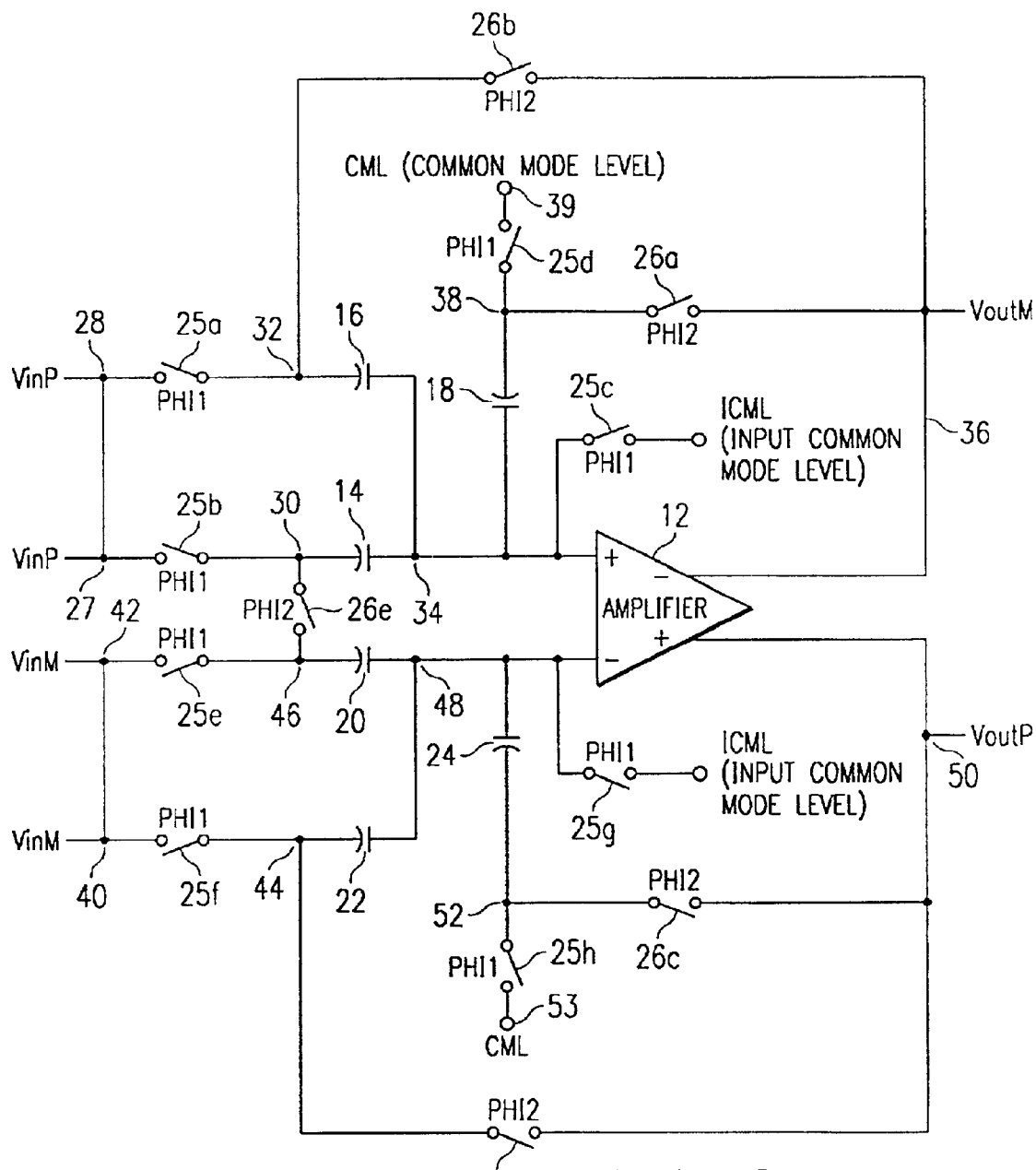
FIG. 3 illustrates an alternative embodiment of a sample and hold circuit implemented according to the teachings of the present invention.

In an additional embodiment of sample and hold circuit 10 illustrated in FIG. 3, the feedback paths utilized between each of nodes 34 and 36, that includes switch 25c, and nodes 48 and 50, that includes switch 25g, may be eliminated by utilizing switches 25c and 25g to couple nodes 34 and 48 to a common mode level voltage. Thus, coupling nodes 34 and 48 to the common mode level voltage serves to bring the inputs to operational amplifier 12 at nodes 34 and 48 to a common mode level voltage previously brought about by the presence of feedback paths connecting node 34 to node 36 and node 48 to node 50.

The described operation of sample hold circuit 10 allows the magnitude of an analog voltage input to be sampled and held at the output of operational amplifier 12 utilizing a close loop gain of only one-half. As the bandwidth and response time of sample and hold circuit 10 are functions of the closed loop gain of operational amplifier 12, by reducing the required gain from one to one-half, the bandwidth of sample and hold circuit 10 is doubled. Similarly, the response time required for sample and hold circuit 10 to sample and hold the magnitude of an analog signal may be effectively halved. Thus, the implementation of sample and hold circuit 10, in any of the described embodiments of this invention, may eliminate bottlenecks previously presented in many high speed applications by prior implementations of sample and hold circuits.

Although the present invention has been described using several embodiments, various changes and modifications may be suggested to one skilled in the art after a review of this description. It is intended that the present invention encompass such changes and modifications as fall within the scope of the appended claims.

What is claimed is:

1. A differential sample and hold circuit, the sample and hold circuit comprising an operational amplifier, the operational amplifier having a closed loop gain of one-half, the sample and hold circuit further comprising two feedback paths.

2. The differential sample and hold circuit of claim 1, the sample and hold circuit further comprising at least three switched capacitors.

3. The differential sample and hold circuit of claim 1, the two feedback paths comprising an input capacitor.

4. The differential sample and hold circuit of claim 1, the two feedback paths further comprising a first and second feedback path, an input capacitor, and a first and second input node, the second feedback path including a feedback capacitor and a switch, each first and second input nodes operable to receive an analog signal to be sampled that is applied at each of the nodes, the first input node being coupled to the input capacitor.

5. The differential sample and hold circuit of claim 1, the sample and hold circuit further comprising a first and second feedback path and an input capacitor, the sample and hold circuit operable to sample an analog signal at a first and second node, the sample and hold circuit operable to introduce at an output of the operational amplifier a first closed loop gain of one-half with respect to a voltage at the first node and a second closed loop gain of one-half with respect to a voltage at the second node, the voltage of the magnitude of the analog signal being tracked at the output of the operational amplifier by summing the first and second closed loop gains.

6. The differential sample and hold circuit of claim 1, wherein the operational amplifier is a differential operational amplifier and wherein a differential output of the operational amplifier tracks a differential input applied to the sample and hold circuit using a closed loop gain of one-half.

7. The differential sample and hold circuit of claim 1, wherein the operational amplifier is a differential operational amplifier and wherein a differential output of the operational amplifier tracks a differential input applied to the sample and hold circuit using a closed loop gain of one-half, the differential input being tracked by applying the differential input across two sets of nodes.

8. The differential sample and hold circuit of claim 1, and further comprising a plurality of switched capacitors, each of the switched capacitors having the same capacitance.

9. A differential sample and hold circuit, the differential sample and hold circuit comprising:
an operational amplifier; and
a plurality of switched capacitors coupled to the operational amplifier, the switched capacitors introducing a closed loop gain of one-half for the operational amplifier.

10. The differential sample and hold circuit of claim 9, and further comprising at least two input nodes operable to receive the same analog input signal, the voltage level at each input node being modified by a gain of one-half and summed at an output of the operational amplifier.

11. The differential sample and hold circuit of claim 9, wherein the switched capacitors all have the same capacitance.

12. The differential sample and hold circuit of claim 9, wherein the operational amplifier is a differential operational amplifier and wherein the sample and hold circuit is operable to sample a differential input signal at two sets of differential input nodes, the sample and hold circuit summing the voltage level of the differential input signal at each of the differential input nodes at a gain of one-half at a differential output of the operational amplifier, the sum of the two voltage levels at a gain of one-half being equal to the magnitude of the sampled differential input signal.

13. The differential sample and hold circuit of claim 9, wherein the switched capacitors include a plurality of switches and capacitors, the switches operable to define a first time during which an analog signal is sampled and a second time during which the one-half of the magnitude of the analog signal is reflected at an output of the operational amplifier.

14. A differential sample and hold circuit, the sample and hold circuit comprising:
an operational amplifier, the operational amplifier having a first input and a second input and an output;

a first feedback path of the operational amplifier, the first feedback path including a first capacitor coupled to the first input of the operational amplifier and a first switch coupled to the output of the operational amplifier;

a second feedback path including a second capacitor coupled to the first input of the operational amplifier and a second switch coupled to the output of the operational amplifier; and a third capacitor coupled to the first input of the operational amplifier.

15. The differential sample and hold circuit of claim 14, wherein the operational amplifier is a differential operational amplifier.

16. The differential sample and hold circuit of claim 14, and further comprising a third feedback path including a third switch and operable to couple the first input of the operational amplifier to a common mode level voltage.

17. The differential sample and hold circuit of claim 14, and further comprising:

a third feedback path of the operational amplifier, the third feedback path including a fourth capacitor coupled to the second input of the operational amplifier and a third switch coupled to a second output of the operational amplifier;

a fourth feedback path including a fifth capacitor coupled to the second input of the operational amplifier and a fourth switch coupled to the second output of the operational amplifier; and a sixth capacitor coupled to the second input of the operational amplifier.

18. The differential sample and hold circuit of claim 14, wherein the first, second, and third capacitors have an equivalent capacitance, the first, second and third capacitors introducing a first and second closed loop gain at the output of the operational amplifier, the first closed loop gain being with respect to a first input node of the sample and hold circuit, the second closed loop gain being with respect to a second input node of the sample and hold circuit, the first and second input node being operable to sample the same analog input.

19. The differential sample and hold circuit of claim 14, and further comprising additional switches operable to apply a common mode level voltage to nodes of the sample and hold circuit.

20. The differential sample and hold circuit of claim 14, and further comprising two sets of switches, each set of switches operable to open and close in response to an indicated time sequence.

* * * * *